(12) United States Patent
Harano et al.

(10) Patent No.: US 8,338,272 B2
(45) Date of Patent: Dec. 25, 2012

(54) METHOD FOR MANUFACTURING A SEMICONDUCTOR DEVICE

(75) Inventors: Yuichi Harano, Tokyo (JP); Hidenori Suzuki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 777 days.

(21) Appl. No.: 12/480,077

(22) Filed: Jun. 8, 2009

(65) Prior Publication Data

US 2010/0055879 A1 Mar. 4, 2010

(30) Foreign Application Priority Data

Aug. 29, 2008 (JP) .................................. 2008-220638

(51) Int. Cl.
*H01L 21/326* (2006.01)
(52) U.S. Cl. ........ 438/466; 438/706; 438/710; 438/714; 438/E21.327
(58) Field of Classification Search .................. 438/466, 438/480, 706, 710, 714–715, 778; 361/234; 156/345
See application file for complete search history.

(56) References Cited

U.S. PATENT DOCUMENTS

| | | | | |
|---|---|---|---|---|
| 5,270,266 A | * | 12/1993 | Hirano et al. | 438/715 |
| 5,320,982 A | * | 6/1994 | Tsubone et al. | 438/714 |
| 5,548,470 A | | 8/1996 | Husain et al. | |
| 6,252,758 B1 | | 6/2001 | Nagao et al. | |
| 6,648,976 B1 | | 11/2003 | Matsuda et al. | |
| 6,778,377 B2 | | 8/2004 | Hagi | |
| 2002/0170882 A1 | | 11/2002 | Akiba | |

FOREIGN PATENT DOCUMENTS

| | | |
|---|---|---|
| JP | 62-290133 A | 12/1987 |
| JP | 6-291174 A | 10/1994 |
| JP | 7-335570 A | 12/1995 |
| JP | 8-55905 A | 2/1996 |
| JP | 10-64988 A | 3/1998 |
| JP | 11-135602 A | 5/1999 |
| JP | 2000-21964 A | 1/2000 |
| JP | 2001-152335 A | 6/2001 |
| JP | 2002-9140 A | 1/2002 |
| JP | 2002-270680 A | 9/2002 |
| JP | 2006-237645 A | 9/2006 |
| JP | 2007-273490 A | 10/2007 |
| WO | 2005/101472 A1 | 10/2005 |

* cited by examiner

Primary Examiner — Dung A. Le
(74) Attorney, Agent, or Firm — Mattingly & Malur, PC

(57) ABSTRACT

A wafer is mounted on the top surface of the stage having an electrostatic chuck function, and the wafer at 50° C. or more is cooled to a temperature lower than 50° C. In this step, the voltage to be applied to the internal electrode provided in the stage is raised stepwise to gradually increase the contact area between the back surface of the wafer and the top surface of the stage. Finally, a chuck voltage is applied to the internal electrode, so that the entire back surface of the wafer is uniformly attracted to the top surface of the stage. This reduces damage occurring in the top surface of the stage due to rubbing between the back surface of the wafer and the top surface of the stage.

12 Claims, 10 Drawing Sheets

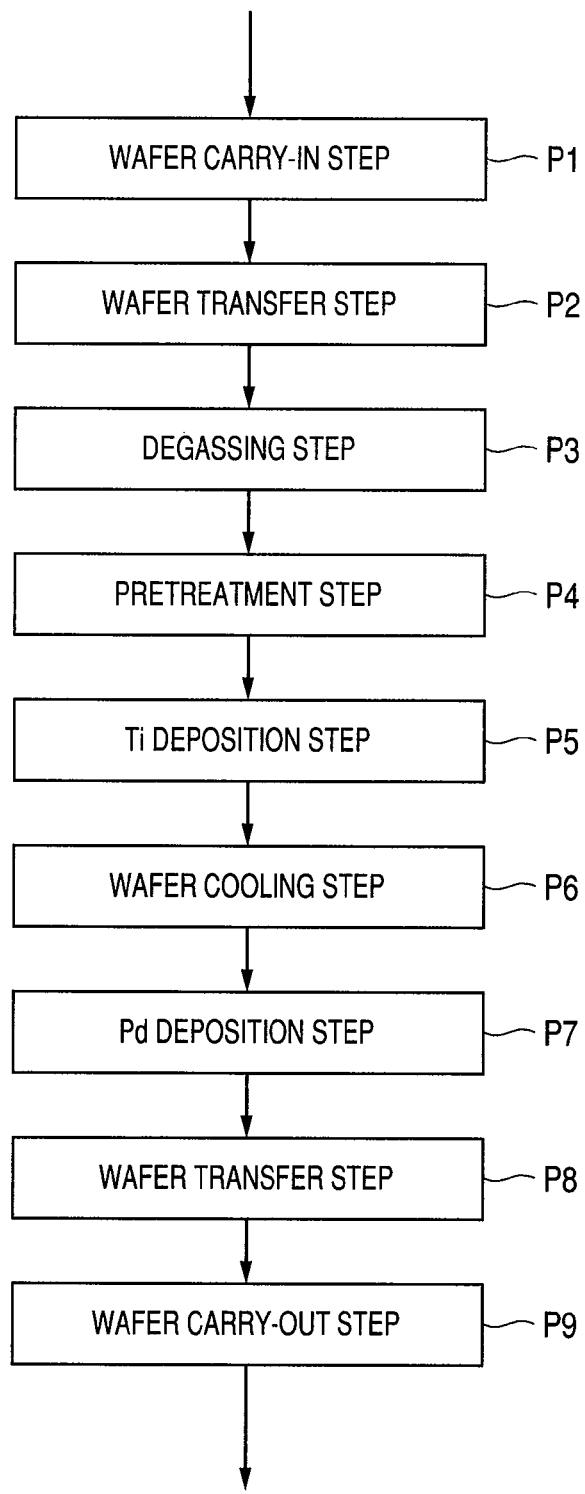

|  | 1 STEP | | 2 STEP | | | |
|---|---|---|---|---|---|---|
| TREATMENT TIME | 15sec | 60sec | — | 0.1sec | 15sec | 0.1sec |
| VOLTAGE | 0.3kV | 0.3kV | 0.6kV | 0.6kV | 0.6kV | 0.0kV |

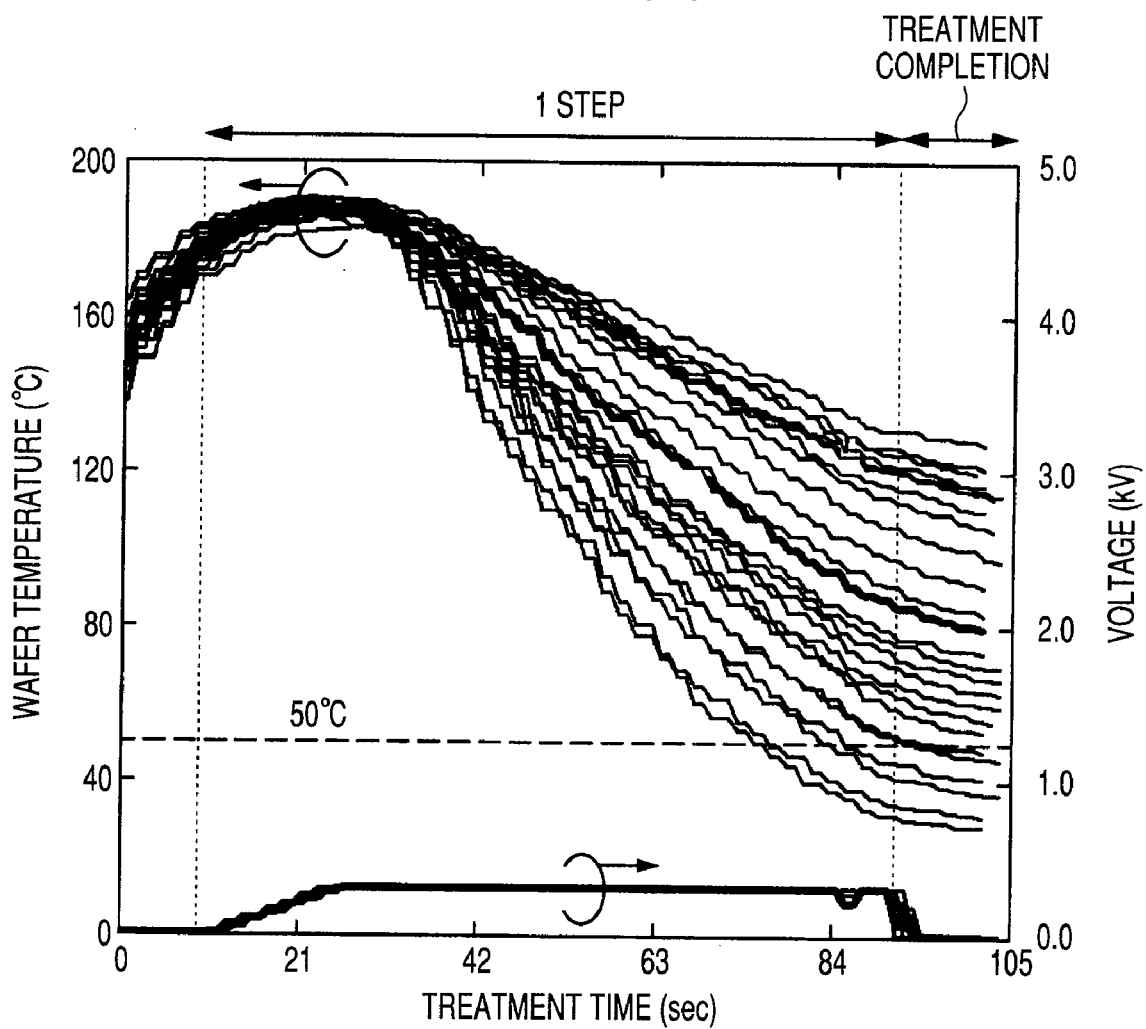

METHOD FOR MANUFACTURING A SEMICONDUCTOR DEVICE

CROSS-REFERENCE TO RELATED APPLICATIONS

The disclosure of Japanese Patent Application No. 2008-220638 filed on Aug. 29, 2008 including the specification, drawings and abstract is incorporated herein by reference in its entirety.

BACKGROUND OF THE INVENTION

The present invention relates to a technique of manufacturing a semiconductor device. More particularly, it relates to a technology effectively applicable to a manufacturing process in which a wafer is attracted to the top surface of a stage by electrostatic chucking, and the wafer is cooled.

For example, Japanese Unexamined Patent Publication No. 2001-152335 (Patent Document 1) discloses the following vacuum treatment method: for allowing a heating or cooling body to attract a to-be-treated object, and heating or cooling the to-be-treated object in vacuum, during at least the interval in which the temperature of the to-be-treated object reaches a prescribed temperature, a prescribed voltage is applied to an attraction electrode disposed at the heating or cooling body so that the applied voltage accumulatively increases in the case of heating, or so that the applied voltage accumulatively decreases in the case of cooling.

Whereas, Japanese Unexamined Patent Publication No. Hei 6 (1994)-291174 (Patent Document 2) discloses the following wafer attracting and holding method: the power source of an electrostatic chuck is formed as a variable voltage source, and the source voltage is reduced for attraction of the wafer to reduce the number of particles deposited on the wafer, and the source voltage is increased for the treatment after attraction to improve the cooling action of the electrostatic chuck.

Further, Japanese Unexamined Patent Publication No. Hei 8 (1996)-55905 (Patent Document 3) discloses the following method: the dielectric layer over the front surface of an electrostatic chuck is allowed to have a prescribed surface roughness and a pattern of grooves capable of including an inert gas even under a high vacuum, thereby to improve the uniformity of the wafer temperature.

Still further, Japanese Unexamined Patent Publication No. Hei 7 (1995)-335570 (Patent Document 4) discloses the following method for controlling the substrate temperature: in a plasma treatment method, a dielectric layer is disposed between a substrate and a substrate support electrode, and a direct current voltage is applied between the substrate and the substrate support electrode, and as a result, for allowing the substrate support electrode to electrostatically attract the substrate thereto, the direct current voltage is changed, thereby to change the electrostatic attraction force, which changes the substrate temperature.

Whereas, Japanese Unexamined Patent Publication No. Sho 62 (1987)-290133 (Patent Document 5) discloses the following dry etching method: over a stage held at a constant temperature, an electrostatic chuck having at least one pair of electrodes is placed, and the voltage applied to across the one pair of electrodes is changed, so that the degree of the thermal contact between a to-be-etched object and the stage is changed, thereby to control the temperature of the to-be-etched object,

[Patent Document 1]
Japanese Unexamined Patent Publication No. 2001-152335

[Patent Document 2]
Japanese Unexamined Patent Publication No. Hei 6 (1994)-291174

[Patent Document 3]
Japanese Unexamined Patent Publication No. Hei 8 (1996)-55905

[Patent Document 4]
Japanese Unexamined Patent Publication No. Hei 7 (1995)-335570

[Patent Document 5]
Japanese Unexamined Patent Publication No. Sho 62 (1987)-290133

SUMMARY OF THE INVENTION

A surface mounting technology adopting BGA: Ball Grid Array has been developed during the mid 1990s from demands for higher speed and higher density mounting of semiconductor products. Currently, the development of a package of the same size as that of a semiconductor chip manufactured still in a wafer state, namely, a wafer-level CSP (Chip Size Package) has been pursued in a variety of different structures by respective companies. The wafer-level CSP is a merged technology of a wafer process (pre-step) and a package process (post-step). Thus, the package size is reduced with reduction of the chip size. For this reason, the number of semiconductor chips obtainable from a wafer increases, which can reduce the cost of the semiconductor products.

Incidentally, with the FC (Flip Chip)-BGA coupling in the wafer-level CSP, a bump electrode is electrically coupled onto an extraction electrode which is the uppermost layer wire of a semiconductor device. Thus, an UBM (Under Bump Metal) for preventing the interdiffusion is formed between the extraction electrode and the bump electrode. The present inventors use an Au (gold)-plated film in order to obtain a low electric resistance for the bump electrode, and use a Ti (titanium) film for the UBM in consideration of the function of preventing interdiffusion, general versatility, cost, or the like. Incidentally, there may be used a lamination film obtained by forming, under the Ti film, for example, a TiN (titanium nitride) film, a Cu (copper) film, or a Cr (chromium) film.

Further, over the UBM, a Pd (palladium) seed layer is formed for improving the wettability of the Au-plated film. This can achieve the strong coupling strength between the bump electrode and the UBM, which can prevent peeling of the bump electrode. However, for the formation of the Pd seed layer, there are various technical problems described below.

Currently, the present inventors form the Pd seed layer by a sputtering process. However, when the Pd seed layer is formed over the main surface of a wafer at a temperature equal to, or higher than 50° C., Pd and Ti forming the underlying UBM unfavorably react with each other. Thus, first, a Ti film is deposited over the main surface of the wafer at a temperature of about 200 to 300° C. with a sputtering process. Subsequently, the wafer is mounted over the top surface of a stage having an ESC (Electron Static Chuck) function held at, for example, −10° C., and is cooled to, for example, about room temperature. Then, a Pd film is deposited over the main surface of the wafer by a sputtering process.

However, the high-temperature wafer is attracted to the top surface of the stage by electrostatic chucking, and the temperature of the wafer is rapidly cooled. Accordingly, the back surface (the opposite side surface from the main surface) of the wafer and the top surface of the stage are rubbed due to thermal expansion or thermal shrinkage of the wafer, or the like, so that the top surface of the stage is damaged, resulting in occurrence of foreign matters with a size of about 1 to 5 μm. The foreign maters occurred on the top surface of the stage are deposited on the back surface side of the wafer. Alternatively, when the wafer is mounted on the top surface of the stage, the foreign matters are swirled up, and are also deposited on the main surface side of the wafer.

When the foreign matters are deposited on the back surface side of the wafer, for example, in the photoresist step, defocus occurs. Whereas, when the foreign matters are deposited on the main surface side, for example, the defective shape of an element or poor coupling between electrodes occur. For these and other reasons, the presence of the foreign matters occurred on the top surface of the stage is one factor to cause reduction of the manufacturing yield of the semiconductor device. The term "foreign matters" herein used denotes a high dielectric material mainly coating the surface of the stage, such as B (boron) or N (nitrogen).

It is an object of the present invention to provide a technology capable of preventing dust generation caused by rubbing of the wafer attracted to the stage by electrostatic chucking and the stage, and improving the manufacturing yield of the semiconductor device.

The foregoing and other objects, and novel features of the present invention will become apparent from the description in the present specification and the accompanying drawings.

A summary of one embodiment of typical ones of the inventions disclosed in the present application will be described in brief as follows.

Namely, there is provided a method for manufacturing a semiconductor device, which includes: a step of mounting, over the top surface of a stage at a first temperature having an electrostatic chuck mechanism, a semiconductor substrate at a second temperature higher than the first temperature, and cooling the semiconductor substrate to a third temperature lower than the second temperature, wherein in the cooling step, the control voltage to be applied to an electrode of the electrostatic chuck mechanism is gradually increased toward the higher voltage side than the control voltage to be applied at the initial stage of the cooling step.

The advantageous effect obtainable by one embodiment of typical ones of the inventions disclosed in the present application will be described in brief as follows.

Dust generation caused by rubbing of the wafer and the stage is prevented, so that the temperature is cooled to a prescribed temperature in a short time while reducing the number of foreign matters deposited on the main surface side and the back surface side of the wafer. This can improve the manufacturing yield of the semiconductor device.

BRIEF DESCRIPTION OF THE DRAWINGS

FIG. 3 is a manufacturing process flowchart of steps of forming a bump electrode in accordance with one embodiment of the present invention;

FIG. 5A is a diagram summarizing one example of the setting conditions of 1-step electrostatic chucking studied by the present inventors, and FIG. 5B is a graph diagram showing the changes in temperature of the wafer obtained under the setting conditions;

DETAILED DESCRIPTION OF THE PREFERRED EMBODIMENTS

In description of the following embodiment, the embodiment may be described in a plurality of divided sections or embodiments for convenience, if required. However, unless otherwise specified, these are not independent of each other, but are in a relation such that one is a modification example of a part or the whole of the other, or details, complementary explanation, or the like of the other.

Further, in the following embodiments, when a reference is made to the number of elements, and the like (including number, numerical value, quantity, range, or the like), the number of elements is not limited to the specific number, but may be greater than or less than the specific number, unless otherwise specified, or except the case where the number is apparently limited to the specific number in principle. Further in the following embodiments, it is needless to say that the constitutional elements (including element steps, or the like) are not always essential, unless otherwise specified, or except the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numerical values and ranges.

Further, in the following embodiments, the term "wafer" herein used mainly denotes a Si (Silicon) single crystal wafer, but the term "wafer" indicates not only it but also a SOI (Silicon On Insulator) wafer, an insulating film substrate for forming an integrated circuit thereover, or the like. The shape thereof is also not limited to a circle or a nearly circle, but includes a square, a rectangle, or the like.

Whereas, in all the drawings for describing the following embodiments, those having the same function are given the same reference signs and numerals in principle, and a repeated description thereon is omitted. Below, embodiments of the present invention will be described in details by reference to the accompanying drawings.

Figure 1:
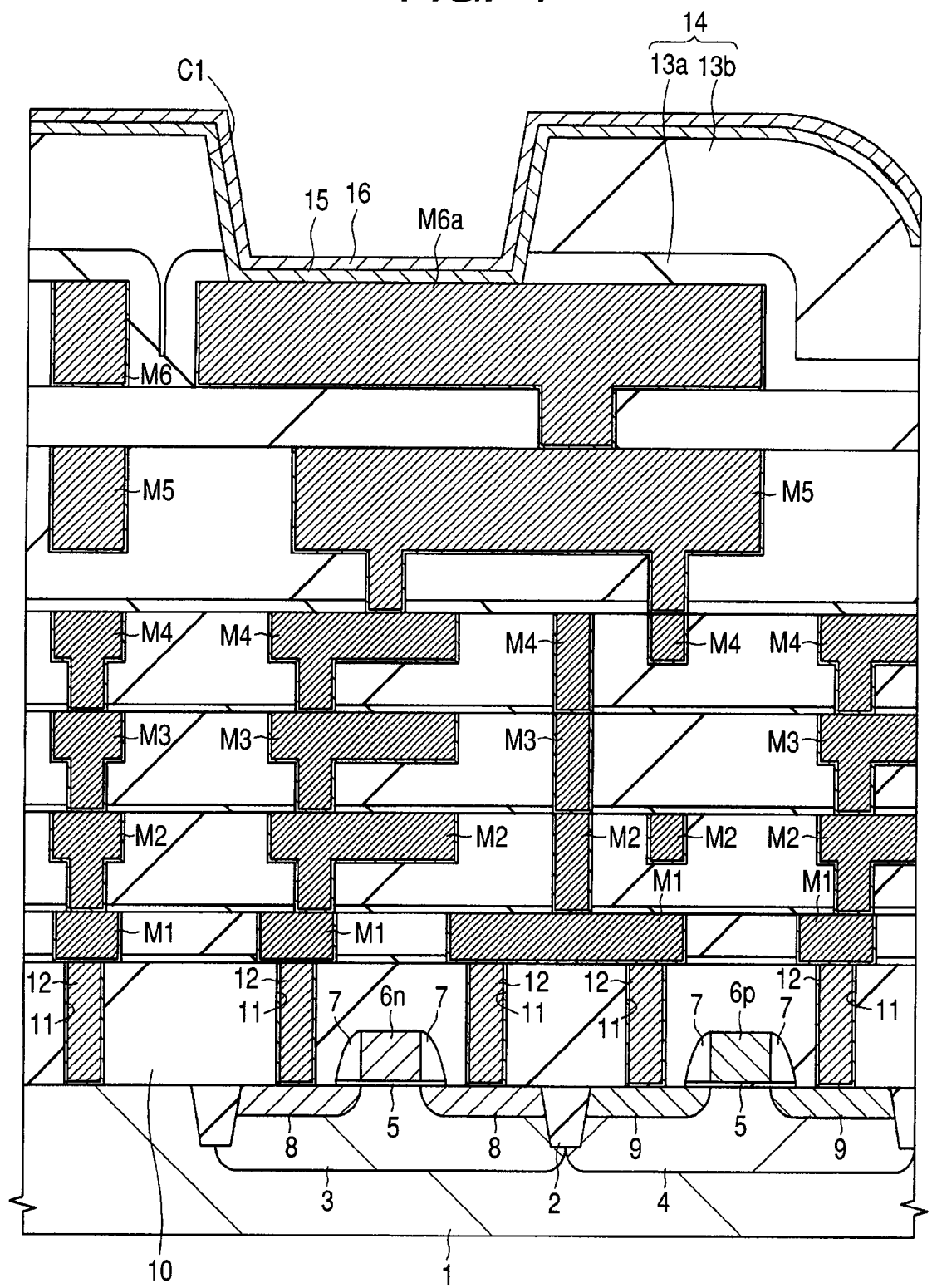
FIG. 1 is a cross sectional view of an essential part during a manufacturing step of a semiconductor device including a CMOS device and a multilayer wire in accordance with one embodiment of the present invention.
Figure 2:
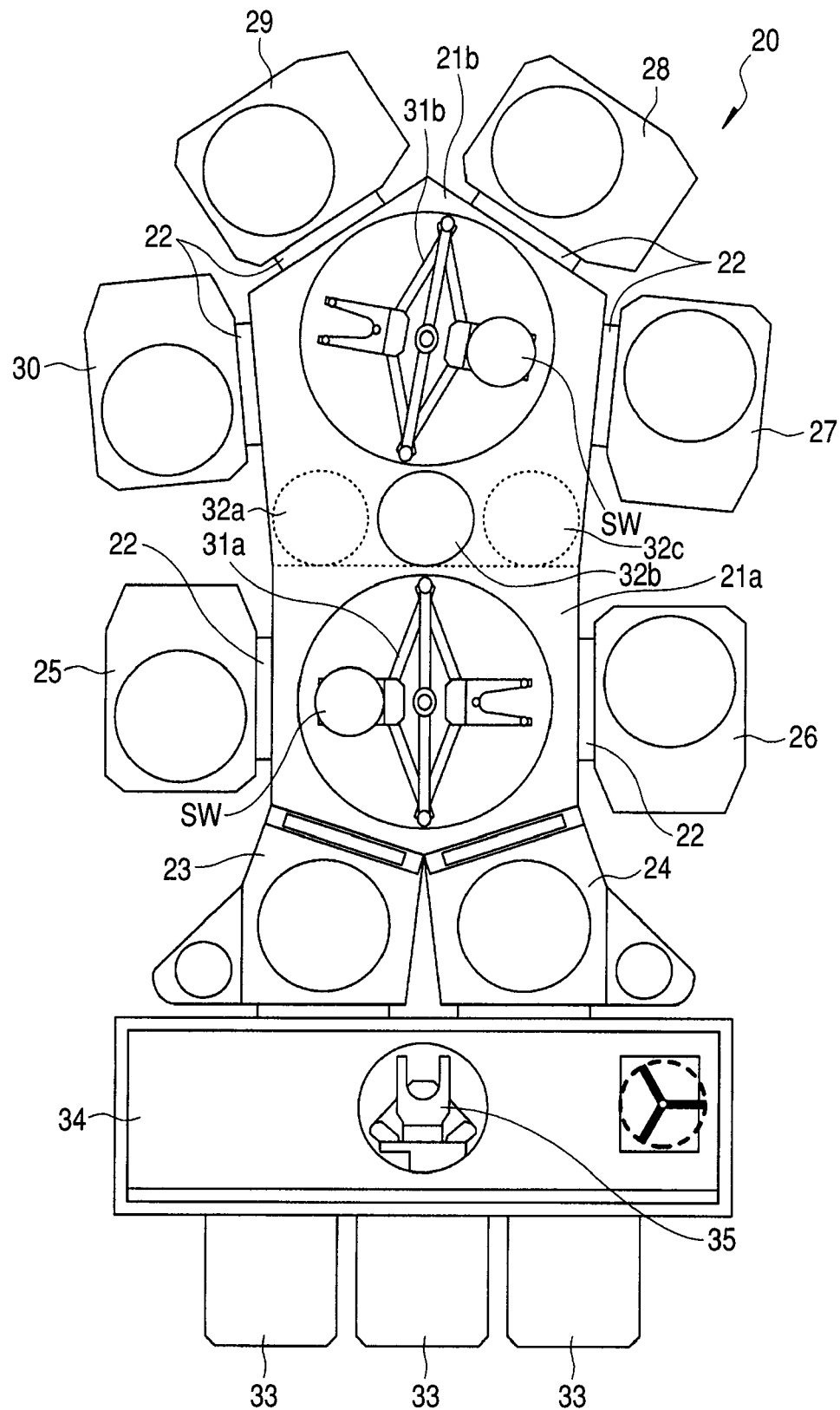
FIG. 2 is a schematic plan view of a deposition device for forming an UBM and a seed layer in accordance with one embodiment of the present invention.
Figures 4A, 4B:
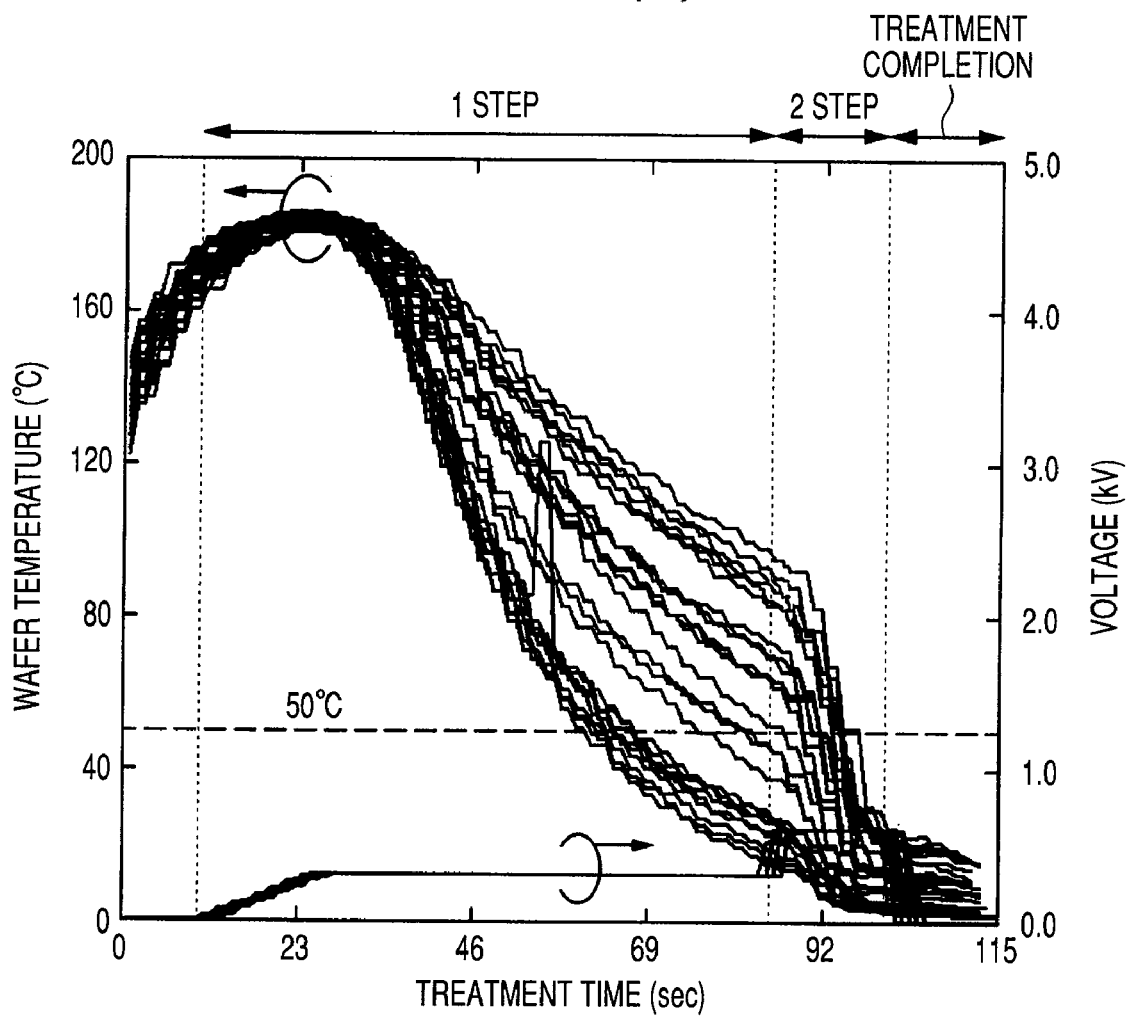
FIG. 4A is a diagram summarizing one example of the setting conditions of 2-step electrostatic chucking in accordance with one embodiment of the present invention.
FIG. 4B is a graph diagram showing the changes in temperature of the wafer obtained under the setting conditions.
Figure 7:
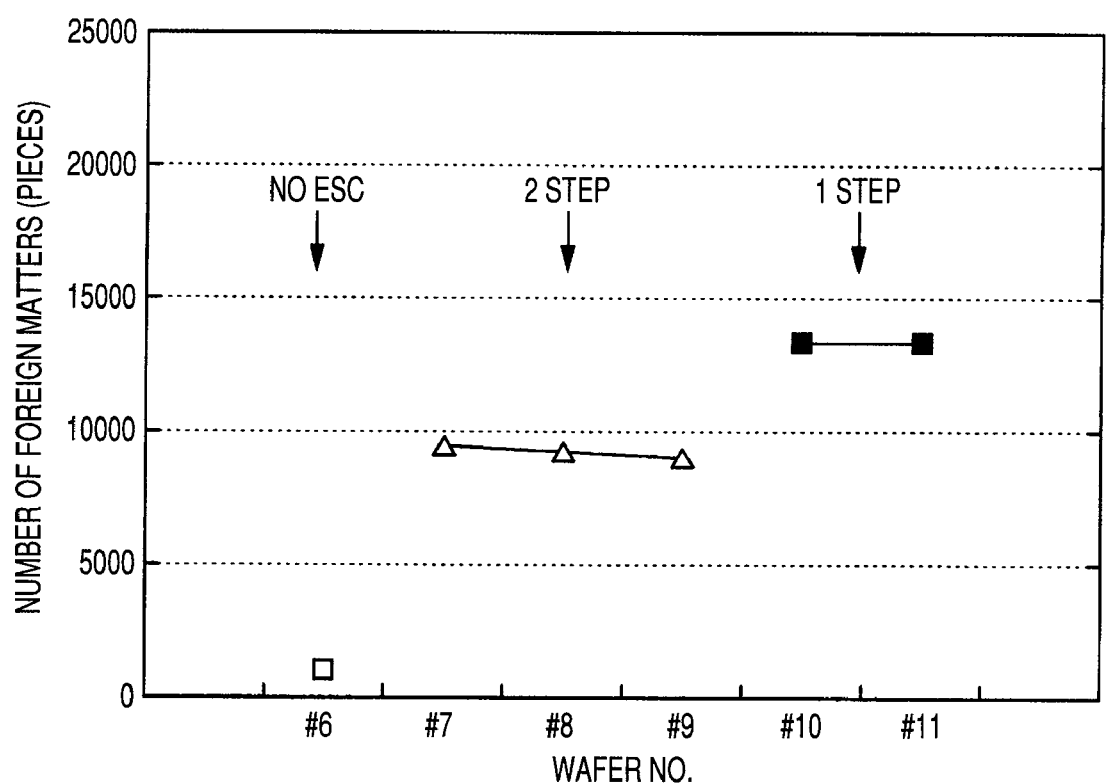
FIG. 7 is a graph diagram summarizing the number of foreign matters deposited on the entire back surface of the semiconductor wafer in the method for cooling the wafer using 2-step electrostatic chucking in accordance with one embodiment of the present invention.
Figure 8:
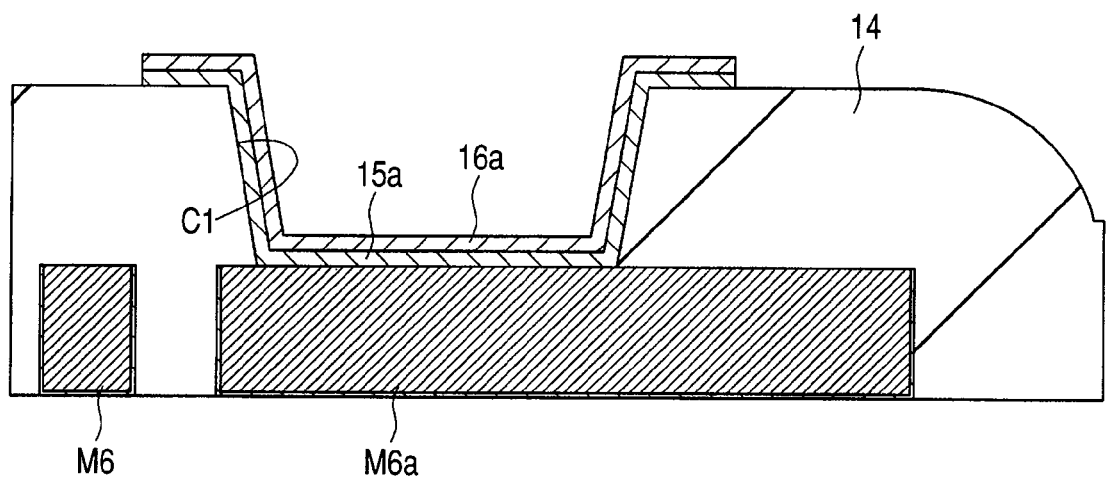
FIG. 8 is a cross sectional view of an essential part during the manufacturing step of the semiconductor device following FIG. 1.
Figure 9:
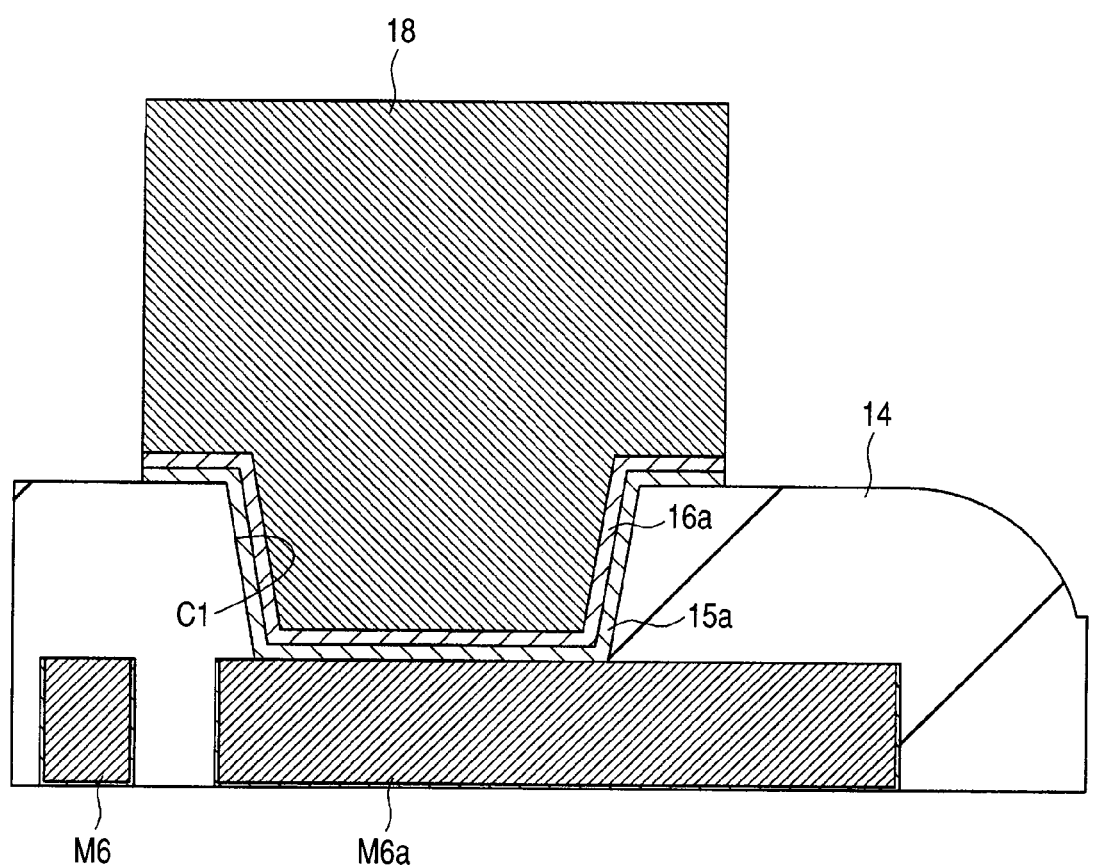
FIG. 9 is a cross sectional view of an essential part during the manufacturing step of the semiconductor device following FIG. 8.
Figure 10:
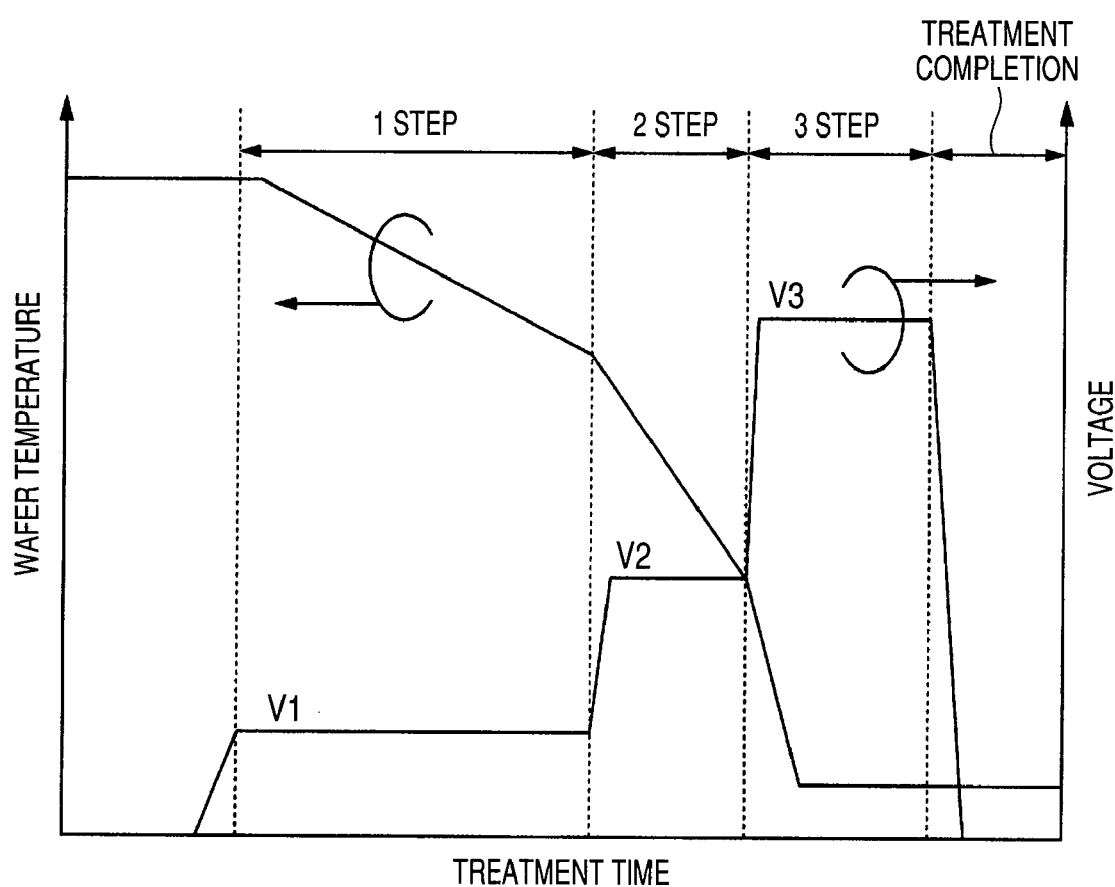
FIG. 10 is a schematic graph diagram illustrating the method for cooling a wafer using 3-step electrostatic chucking in accordance with one embodiment of the present invention.

The method for manufacturing a semiconductor device having bump electrodes to be coupled to an electrode layer in accordance with one embodiment of the present invention will be described step by step by reference to FIGS. 1 to 10. FIG. 1 is a cross sectional view of an essential part during a manufacturing step of a semiconductor device including a CMOS device and a multilayer wire in accordance with the present embodiment; FIG. 2 is a schematic plan view of a deposition device for forming an UBM and a seed layer in accordance with the present embodiment; FIG. 3 is a manufacturing process flowchart of steps of forming a bump electrode in accordance with the present embodiment; FIGS. 4A and 4B are diagrams illustrating a method for cooling a semiconductor wafer using 2-step electrostatic chucking in accordance with the present embodiment; FIGS. 5A and 5B and 6A and 6B are views illustrating the method for cooling a semiconductor wafer using 1-step electrostatic chucking studied by the present inventors; FIG. 7 is a graph diagram summarizing the number of foreign matters deposited on the entire back surface of the semiconductor wafer in the method for cooling a semiconductor wafer using 2-step electrostatic chucking in accordance with the present embodiment; FIG. 8 is a cross sectional view of an essential part during the manufacturing step of the semiconductor device following FIG. 1; FIG. 9 is a cross sectional view of an essential part during the manufacturing step of the semiconductor device following FIG. 8; and FIG. 10 is a graph diagram illustrating the method for cooling a semiconductor wafer using 3-step electrostatic chucking in accordance with the present embodiment.

First, as shown in FIG. 1, desired semiconductor elements are formed over the main surface of a semiconductor substrate (a semiconductor wafer processed in a circular thin plate) 1 formed of a Si (silicon) single crystal. As the semiconductor elements, there are formed, for example, a CMOS (Complementary Metal Oxide Semiconductor) device, resistive elements, capacitance elements, and the like. However, in this embodiment, the CMOS device is exemplified. Incidentally, the p channel type MISFET (Metal Insulator Semiconductor Field Effect Transistor) forming the CMOS device is abbreviated as pMIS, and the n channel type MISFET is abbreviated as nMIS.

Then, in an element isolation region of the main surface of the semiconductor substrate 1, an isolation part 2 formed of an insulating film is formed. Then, into the semiconductor substrate 1, impurities showing a p type conductivity are ion implanted to form a p well 3. Similarly, impurities showing an n type conductivity are ion implanted to form an n well 4. Subsequently, a gate insulating film 5, and gate electrodes 6n and 6p forming an NMIS and a PMIS are formed. Further, a sidewall 7 is formed at each sidewall of the gate electrodes 6n and 6p. Subsequently, in the p well 3 on the opposite sides of the gate electrode 6n, impurities showing an n type conductivity are ion implanted to form an n type semiconductor region 8 functioning as the source/drain of the NMIS in a self-aligned manner with respect to the gate electrode 6n and the sidewall 7. Similarly, in the n well 4 on the opposite sides of the gate electrode 6p, impurities showing a p type conductivity are ion implanted to form a p type semiconductor region 9 functioning as the source/drain of the pMIS in a self-aligned manner with respect to the gate electrode 6p and the sidewall 7.

Then, over the main surface of the semiconductor substrate 1, an insulating film 10 is formed. Then, the insulating film 10 is processed by etching using a resist pattern as a mask to form contact holes 11. The contact holes 11 are formed in the necessary parts over the n type semiconductor region 8 or over the p type semiconductor region 9, and the like. Subsequently, inside each contact hole 11, a plug 12 including, for example, W (tungsten) as a main conductor is formed. Then, a first-layer wire M1 to be coupled to the plugs 12 is formed. The wire M1 includes, for example, Cu as a main conductor, and is formed with a single damascene process. Further, the overlying second-layer wire M2 to sixth-layer wire M6 are formed. The wires M2 to M5 include, for example, Cu as a main conductor, and are formed with a dual damascene process. The wire M6 includes, for example, Al (aluminum) as a main conductor, and is formed by processing the Al film deposited over the main surface of the semiconductor substrate 1 by etching using a resist pattern as a mask. The thickness of the wire M6 is, for example, 1 μm. Incidentally, in this embodiment, the sixth-layer wire M6 is assumed to include Al as a main conductor, but may also include Cu as a main conductor. Further, the number of the wiring layers is set to be 6. However, the number of layers is not limited thereto.

Then, over the main surface of the semiconductor substrate 1, a silicon nitride film 13a is formed. Over the silicon nitride film 13a, a silicon oxide film 13b is formed. The silicon nitride film 13a and the silicon oxide film 13b function as a passivation film 14 for preventing penetration of external moisture and impurities, and suppressing transmission of an α ray. Subsequently, the silicon oxide film 13b and the silicon nitride film 13a are successively processed by etching using a resist pattern as a mask, thereby to form a first opening C1 for exposing a bonding pad part M6a which is a part of the sixth-layer wire M6.

Then, a first metal film 15 to be coupled to the bonding pad part M6a through the first opening C1 is formed over the main surface of the semiconductor substrate 1. Then, a second metal film 16 is formed over the first metal film 15. As the first metal film 15, there is used a metal film which functions as a barrier metal for suppressing diffusion of Au, and in addition, has properties of low contact electric resistance, low sheet resistance, and the like, such as a Ti film, a TiN film, a Cu film, a Cr film, a W film, a TiW (titanium tungsten) film, or a Ta (tantalum) film, or a lamination film of a combination of these. The first metal film 15 is formed with, for example, a sputtering process. The thickness thereof is, for example, 0.15 to 0.2 μm. The first metal film 15 is processed in the subsequent manufacturing step to form an UBM.

As the second metal film 16, there is used a metal film which improves the wettability for forming bump electrodes, and facilitates growth of the material of the bump electrodes, such as a Pd film. The second metal film 16 is formed with, for example, a sputtering process. The thickness thereof is, for example, 0.15 to 0.2 μm. The second metal film 16 is processed in the subsequent manufacturing step to form a seed layer.

Then, by reference to FIGS. 2 to 7, the steps of forming the first metal film 15 and the second metal film 16 will be described in details. Herein, a description will be given to one example of the most preferred method for forming the first metal film 15 and the second metal film 16 when a Ti-containing film (e.g., a Ti film) is used for the first metal film 15, and a Pd-containing film (e.g., a Pd film) is used for the second metal film 16.

For deposition of the first metal film (Ti film) 15 and the second metal film (Pd film) 16, a deposition device 20 shown in FIG. 2 is used. The deposition device 20 is of a multichamber type, in which two transfer chambers of a first transfer chamber 21a and a second transfer chamber 21b are disposed, and two loader/unloader 23 and 24, and two chambers 25 and 26 are included around the first transfer chamber 21a via gate valves 22 which are opening/closing means, and four chambers 27, 28, 29, and 30 are included around the second transfer chamber 21b via gate valves 22 which are opening/closing means. The first transfer chamber 21 is held at a prescribed degree of vacuum by an evacuation mechanism or the like, and is provided at the central part with a transfer robot 31a of a multiarticular arm structure for transferring a semiconductor wafer (which may also be simply referred to as a wafer) SW. Similarly, the second transfer chamber 21b is held at a prescribed degree of vacuum by an evacuation mechanism or the like, and is provided at the central part with a transfer robot 31b for transferring a semiconductor wafer SW. Between the first transfer chamber 21a and the second transfer chamber 21b, there are transfer stages 32a, 32b, and 32c for performing transfer of the semiconductor wafer SW, which can also be used for cooling the semiconductor wafer SW. Between the loader/unloader 23 and 24 and ports on which externally transferred semiconductor wafers SW are set, there is disposed a load lock 34 which can be adjusted to a prescribed degree of vacuum by an evacuation mechanism or the like. The load lock 34 is provided at the central part thereof with a transfer robot 35 of a multiarticular arm structure.

The chambers 25 and 26 provided in the first transfer chamber 21a is a heat-treatment chamber for performing a heat treatment (degassing). The chamber 27 provided in the second transfer chamber 21b is a dry cleaning treatment chamber for dry cleaning a semiconductor wafer; the chamber 28, a Ti deposition chamber for depositing the first metal film (Ti film) 15 by a sputtering process; the chamber 29, a cooling chamber for cooling the semiconductor wafer SW; and the chamber 30, a Pd deposition chamber for depositing the second metal film (Pd film) with a spurring process. Incidentally, in the deposition device 20, the number of chambers provided in the first transfer chamber 21a is set at two, and the number of chambers provided in the second transfer chamber 21b is set at four. However, the numbers are not limited thereto.

Deposition of the first metal film (Ti film) 15 and the second metal film (Pd film) 16 is carried out in the manner described below according to, for example, the manufacturing process flowchart (steps P1 to P9) shown in FIG. 3 using the deposition device 20.

(Step P1 of FIG. 3) A plurality of semiconductor wafers SW are stored in FOUP's (Front Open Unified Pods) docked to the ports 33 of the deposition device 20. The FOUP is a closed storage container for batch transfer of semiconductor wafers SW, and stores semiconductor wafers SW generally in batches of 25, 12, or 6-wafers, or the like. The container outer wall of the FOUP is in an airtight structure except for the fine air filter part, so that dust is almost completely eliminated. Accordingly, even when a class 1000 atmosphere is transferred, the inside can hold a cleanliness of class 1. Docking with the port 33 is carried out by attracting the door of the FOUP into the inside, and thereby keeping the cleanliness.

One semiconductor wafer SW is taken out from the FOUP by the transfer robot 35, and is transferred into the load lock 34. In order to suppress mixing of the outside air (mainly oxygen) into the transfer chamber or the treatment chamber, the inside of the load lock 34 is once reduced in pressure to 133.32 Pa or less, and then, is returned to atmospheric pressure.

(Step P2 of FIG. 3) Thereafter, the semiconductor wafer SW is transferred from the load lock 34 to the loader/unloader 23 (or loader/unloader 24) by the transfer robot 35.

(Step P3 of FIG. 3) Then, by the transfer robot 31a, the semiconductor wafer SW is vacuum transferred from the loader/unloader 23 (or loader/unloader 24) into the first transfer chamber 21a, and further is vacuum transferred from the first transfer chamber 21a to the heat-treatment chamber 25 (or chamber 26) for performing a heat treatment. In the chambers 25 and 26, stages heated to, for example, 250° C. are provided, respectively. By mounting the semiconductor wafer SW on the top surface of each of the stages, degassing from the semiconductor wafer SW is performed.

(Step P4 of FIG. 3) Then, by the transfer robot 31a, the semiconductor wafer SW is vacuum transferred from the heat-treatment chamber 25 (or chamber 26) to the second transfer chamber 21b. Then, the semiconductor wafer SW is mounted on the top surface of a stage 32b (or stage 32a or 32c) for delivery of a semiconductor wafer SW provided in the second transfer chamber 21b. Subsequently, the semiconductor wafer SW is vacuum transferred from the delivery stage 32b (or stage 32a, or 32c) to the dry cleaning treatment chamber 27 via the second transfer chamber 21b by the transfer robot 31b. The semiconductor wafer SW is mounted over the top surface of the stage set in the chamber 27. Then, a plasma generated by exciting an Ar gas including reducing gases such as a $NF_3$ gas or a $NH_3$ gas added therein is introduced in the chamber 27, and is supplied over the main surface of the semiconductor wafer SW. As a result, the natural oxide film or the like formed over the surface of the bonding pad part M6a is removed. The temperature of the semiconductor wafer SW during the dry cleaning treatment is, for example, 200° C.

(Step P5 of FIG. 3) Then, by the transfer robot 31b, the semiconductor wafer SW is vacuum transferred from the dry cleaning treatment chamber 27 to the Ti deposition chamber 28 via the second transfer chamber 21b, and is mounted over the top surface of the stage included in the chamber 28. The pressure inside the chamber 28 is set at a prescribed degree of vacuum, for example, about $1.33 \times 10^{-6}$ Pa by the evacuation mechanism. Then, the semiconductor wafer SW is heated to a prescribed temperature, and an inert gas is introduced into the chamber 28 at a prescribed flow rate. Thus, the first metal film (Ti film) 15 is deposited over the main surface of the semiconductor wafer SW with a sputtering process. The thickness of the Ti film 15 is, for example, 0.15 to 0.2 μm. The sputtering conditions for deposition are as follows: for example, the deposition temperature is 200 to 350° C.; and the inert gas (Ar) flow rate is 45 sccm.

(Step 6 of FIG. 3) Then, by the transfer robot 31b, the semiconductor wafer SW is vacuum transferred from the Ti deposition chamber 28 to the cooling chamber 29 via the second transfer chamber 21b, and is mounted over the top surface of the stage included in the chamber 29. The temperature of the stage is set within the range of −10° C. to room temperature in order to cool the semiconductor wafer SW to a temperature lower than 50° C. In this embodiment, the setting temperature of the stage is −10° C.

The stage has a function of electrostatic chucking (ESC, electrostatic attraction). Thus, the stage brings the back surface of the semiconductor wafer SW in uniform contact with the top surface of the stage by electrostatic chucking, and thereby holds the semiconductor wafer SW on the top surface of the stage in such a manner as to prevent the semiconductor wafer SW from moving. Electrostatic chucking systems include the bipolar system and the unipolar system. Either system is usable. With the bipolar system, the semiconductor wafer SW is attracted to the top surface of the stage in the following manner. Namely, inside the stage including a dielectric material, tow electrodes (positive electrode and negative electrode) are provided. When a chuck voltage is applied to the internal electrodes, the atoms (or molecules) in the stage are separated to the positively polarized portion and the negatively polarized portion, resulting in charging of the stage. When the semiconductor wafer SW is brought closer to the charged stage, electric charges of the opposite polarity to that of the stage accumulate in the surface of the semiconductor wafer SW facing the stage. Thus, the electric charges of the opposite polarities attract each other, so that the semiconductor wafer SW can be attracted to the top surface of the stage. Whereas, with the unipolar system, the semiconductor wafer SW is attracted to the top surface of the stage in the following manner. Namely, one electrode is provided inside the stage including a dielectric material. A chuck voltage is applied to the internal electrode, so that the atoms (or molecules) in the stage are positively charged. When the semiconductor wafer SW is brought closer to the charged stage, negative charges of the opposite polarity to that of the stage accumulate in the surface of the semiconductor wafer SW facing the stage. Thus, the electric charges of the opposite polarities attract each other, so that the semiconductor wafer SW can be attracted to the top surface of the stage.

In this embodiment, after mounting the semiconductor wafer SW over the top surface of the stage, a chuck voltage is applied to the internal electrode provided in the stage. As a result, the semiconductor wafer SW is electrostatically attracted to the top surface of the stage. However, the voltage to be applied to the internal electrode is not raised at a time, but is raised stepwise or progressively in divided plural times (n times (n≧2)). Thus, the contact area between the back surface of the semiconductor wafer SW and the stage is gradually increased. Finally, a chuck voltage is applied to the internal electrode, so that the entire back surface of the semiconductor wafer SW is uniformly attracted to the top surface of the stage. In this embodiment, the term "chuck voltage" herein used denotes the highest voltage (nth voltage) to be applied to the internal electrode provided in the stage, for allowing the top surface of stage to attract and hold the semiconductor wafer SW thereto. By applying a chuck voltage thereto, it is possible to implement the following states: the semiconductor wafer SW does not move over the top surface of the stage; the semiconductor wafer SW is not curved; and the entire back surface of the semiconductor wafer SW is in uniform contact with the top surface of the stage.

Below, a description will be given to one example of the method for cooling a semiconductor wafer SW adopting 2-step electrostatic chucking.

FIGS. 4A and 4B are diagrams, in which FIG. 4A is a diagram summarizing one example of the setting conditions of 2-step electrostatic chucking in accordance with this embodiment, and FIG. 4B is a graph diagram showing the changes in temperature of the semiconductor wafer obtained under the setting conditions. The axis of ordinate of FIG. 4B denotes the temperature of the semiconductor wafer and the voltage to be applied to the internal electrode provided in the stage. The axis of abscissa shows the treatment time. Thus, the measurement results of 25 semiconductor wafers are shown. The chuck voltage is 0.6 kV.

First, a semiconductor wafer SW is mounted over the top surface of the stage at a temperature of −10° C. so that the back surface of the semiconductor wafer SW faces the top surface of the stage. At this step, a voltage is not applied to the internal electrode.

Then, after about 10 seconds, application of a voltage to the internal electrode is started. The voltage to be applied to the internal electrode is gradually increased so as to reach 0.3 kV (first voltage) at 15 seconds. Thereafter, the semiconductor wafer SW is held with the internal electrode applied with 0.3 kV, thereby to be cooled (first step). The voltage of 0.3 kV applied to the internal electrode is lower than the chuck voltage (0.6 kV). This creates some space between the back surface of the semiconductor wafer SW and the top surface of the stage, resulting in a state in which the entire back surface of the semiconductor wafer SW and the top surface of the stage are not in uniform contact with each other (a state in which the contact area between the back surface of the semiconductor wafer SW and the top surface of the stage is relatively small). Therefore, the temperature of the semiconductor wafer in the first step slowly decreases. Further, the temperature gradient also varies from one semiconductor wafer SW to another. The temperature of the semiconductor wafer SW after holding for 60 seconds at the first step varies within the range of about 20 to 100° C.

Then, after holding for 60 seconds at the first step, the internal electrode is applied with a chuck voltage of 0.6 kV (second voltage). The semiconductor wafer SW is held in this state for 15 seconds, thereby to be cooled (second step). Application of a chuck voltage can eliminate the space between the back surface of the semiconductor wafer SW and the top surface of the stage, resulting in a state in which the entire back surface of the semiconductor wafer SW and the top surface of the stage are in uniform contact with each other (a state in which the contact area between the back surface of the semiconductor wafer SW and the top surface of the stage is relatively large). As a result, it is possible to set the temperature of the semiconductor wafer SW at a lower temperature than 50° C., and to reduce variations in temperature of the semiconductor wafer SW. For example, as shown in FIG. 4B, the temperature of the semiconductor wafer SW after holding for 15 seconds at the second step falls within the range of about 5 to 25° C.

FIGS. 5A and 5B are diagrams, in which FIG. 5A is a diagram summarizing one example of the setting conditions of 1-step electrostatic chucking studied by the present inventors as a comparative example, and FIG. 5B is a graph diagram showing the changes in temperature of the semiconductor wafer obtained under the setting conditions. The axis of ordinate of FIG. 5B denotes the temperature of the semiconductor wafer and the voltage to be applied to the internal electrode provided in the stage. The axis of abscissa shows the treatment time. Thus, the measurement results of 25 semiconductor wafers are shown. The chuck voltage is 0.3 kV.

As shown in FIG. 5, when the internal electrode is applied with a chuck voltage of 0.3 kV, some space is created between the back surface of the semiconductor wafer SW and the top surface of the stage, resulting in a state in which the entire back surface of the semiconductor wafer SW and the top surface of the stage are not in uniform contact with each other. This reduces the friction between the back surface of the semiconductor wafer SW and the top surface of the stage due to thermal shrinkage. However, the temperature of the semiconductor wafer SW slowly decreases. Therefore, even when the semiconductor wafer SW is held for 60 seconds with the internal electrode applied with 0.3 kV, it is difficult to set the temperature of the semiconductor wafer SW to a lower temperature than 50° C. In addition, the temperature of the semiconductor wafer SW varies within the range of about 30 to 120° C.

Figures 6A, 6B:
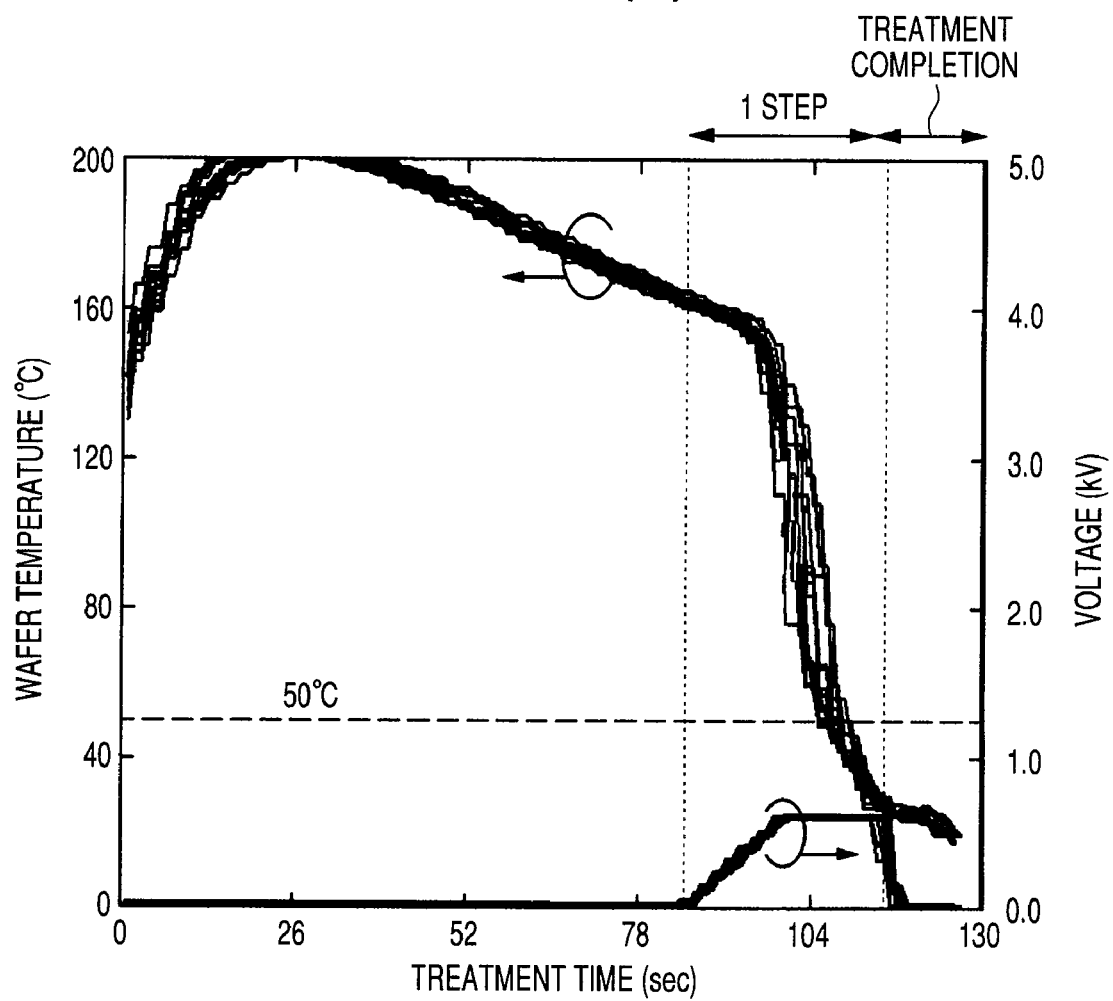
FIG. 6A is a diagram summarizing one example of the setting conditions of 1-step electrostatic chucking studied by the present inventors.
FIG. 6B is a graph diagram showing the changes in temperature of the wafer obtained under the setting conditions.

Whereas, FIGS. 6A and 5B are diagrams, in which FIG. 6A is a diagram summarizing another example of the setting conditions of 1-step electrostatic chucking studied as a comparative example by the present inventors, and FIG. 6B is a graph diagram showing the changes in temperature of the semiconductor wafer obtained under the setting conditions. The axis of ordinate of FIG. 6B denotes the temperature of the semiconductor wafer and the voltage to be applied to the internal electrode provided in the stage. The axis of abscissa shows the treatment time. Thus, the measurement results of 25 semiconductor wafers are shown. The chuck voltage is 0.6 kV.

As shown in FIGS. 6A and 6B, when the internal electrode is applied with a chuck voltage of 0.6 kV, the space between the back surface of the semiconductor wafer SW and the top surface of the stage can be eliminated, resulting in a state in which the entire back surface of the semiconductor wafer SW and the top surface of the stage are in uniform contact with each other. Accordingly, the temperature of the semiconductor wafer SW sharply decreases. For this reason, by holding the semiconductor wafer SW for 15 seconds with the internal electrode applied with 0.6 kV, it is possible to set the temperature of the semiconductor wafer SW to a lower temperature than 50° C., and in addition, it is possible to reduce the variations in temperature of the semiconductor wafer SW. However, the semiconductor wafer SW is sharply cooled from about 160° C. to a lower temperature than 50° C. for 15 seconds. This increases the friction between the back surface of the semiconductor wafer SW and the top surface of the stage due to thermal shrinkage.

FIG. 7 is a graph diagram summarizing the number of foreign matters deposited on the entire back surface of the semiconductor wafer in the method for cooling a semiconductor wafer using 2-step electrostatic chucking (first-step electrostatic chuck voltage: 0.3 kG, second-step electrostatic chuck voltage (chuck voltage): 0.6 kV) in accordance with this embodiment. For comparison, FIG. 7 shows the number of foreign matters deposited on the entire back surface of the semiconductor wafer in a method for cooling a semiconductor wafer without using electrostatic chucking, or a method for cooling a semiconductor wafer using 1-step electrostatic chucking (chuck voltage: 0.6 kV). The axis of ordinate of FIG. 7 denotes the number of foreign matters deposited on the entire back surface of the semiconductor wafer. The axis of abscissa denotes the number of each semiconductor wafer used for the measurement. In the diagram, the measurement results obtained by the method for cooling a semiconductor wafer using 2-step electrostatic chucking are expressed as 2 step, and indicated with a mark Δ; the measurement results obtained by the method for cooling a semiconductor wafer without using electrostatic chucking are expressed as No ESC, and indicated with a mark □; and the measurement results obtained by the method for cooling a semiconductor wafer using 1-step electrostatic chucking are expressed as 1 step, and indicated with a mark ■.

When the internal electrode provided in the stage is not applied with a voltage, the contact between the back surface of the semiconductor wafer and the top surface of the stage is relatively weak. For this reason, the number of foreign matters occurring on the top surface of the stage is small. As a result, the number of foreign matters to be deposited over the entire back surface of the semiconductor wafer SW becomes small, and is reduced to about 1000. In contrast, in the case of 1-step electrostatic chucking in which a chuck voltage of 0.6 kV is applied, the contact between the back surface of the semiconductor wafer and the top surface of the stage is relatively strong, and the thermal shrinkage of the semiconductor wafer SW is large. For these and other reasons, the number of foreign matters occurring on the top surface of the stage becomes large. As a result, the number of foreign matters to be deposited over the entire back surface of the semiconductor wafer becomes large, and about 13000 foreign matters are observed.

In the case of 2-step electrostatic chucking in accordance with this embodiment, about 9000 foreign matters are observed on the entire back surface of the semiconductor wafer SW. The number of foreign matters increases than that in the case where the internal electrode provided in the stage is not applied with a voltage. However, the number of foreign matters decreases by about 30% than that in the case of 1-step electrostatic chucking in which a chuck voltage of 0.6 kV is applied. This is due to the following fact. In the second-step electrostatic chucking, a chuck voltage of 0.6 kV is applied thereto. As shown in FIG. 4 described above, the temperature of the semiconductor wafer SW after holding for 60 seconds in the first step is about 20 to 100° C., and the temperature of the semiconductor wafer SW after holding for 15 seconds in the second step is about 5 to 25° C. Thus, the difference in temperature is smaller than 100° C. Namely, with 2-step electrostatic chucking in accordance with this embodiment, it is possible to make smaller the friction between the back surface of the semiconductor wafer and the top surface of the stage due to thermal shrinkage than that with 1-step electrostatic chucking in which a chuck voltage of 0.6 kV is applied. This can suppress the occurrence of foreign matters over the top surface of the stage.

However, even with 2-step electrostatic chucking in accordance with this embodiment, as the treatment time (wafer holding time) of the second step increases, there increases the time during which the contact between the back surface of the semiconductor wafer and the top surface of the stage is strong. This causes a fear of an increase in number of foreign matters. Thus, desirably, the treatment time of the second step is made shorter than the treatment time of the first step, and is set at a time enough to allow the variations of the semiconductor wafer temperature to converge in the vicinity of the desirable temperature. The treatment time of the second step is considered to be preferably, for example, 15 seconds or less.

(Step P7 of FIG. 3) Then, by the transfer robot 31b, the semiconductor wafer SW is vacuum transferred from the cooling chamber 29 to the Pd deposition chamber 30 via the second transfer chamber, and is mounted over the top surface of the stage provided in the chamber 30. The pressure inside the chamber 30 is set at a prescribed degree of vacuum, for example, about $1.33 \times 10^{-6}$ Pa by the evacuation mechanism. Then, the semiconductor wafer SW is heated to a prescribed temperature, and an inert gas is introduced into the chamber 30 at a prescribed flow rate. Thus, the second metal film (Pd film) 16 is deposited over the main surface of the semiconductor wafer SW with a sputtering process. The thickness of the Pd film 16 is, for example, 0.15 to 0.2 μm. The sputtering conditions for deposition are as follows: for example, the deposition temperature is 20 to 30° C. (about room temperature); and the inert gas (Ar) flow rate is 90 sccm.

(Step P8 of FIG. 3) Then, the semiconductor wafer SW is vacuum transferred from the Pd deposition chamber 30 to the delivery stage 32b (or stage 32a or 32c) by the transfer robot 31b via the second transfer chamber 21b. Subsequently, the semiconductor wafer SW is transferred from the delivery stage 32b (or stage 32a or 32c) to the loader/unloader 23 (or loader/unloader 24) via the first transfer chamber 21a by the transfer robot 31a.

(Step P9 of FIG. 3) Then, the semiconductor wafer SW is stored in the FOUP docked to the port 33 from the loader/unloader 23 (or loader/unloader 24) by the transfer robot 35.

In this manner, it is possible to form the first metal film (Ti film) 15 and the second metal film (Pd film) over the main surface of the semiconductor wafer SW.

Then, as shown in FIG. 8, the second metal film 16 and the first metal film 15 are successively processed by etching using a resist pattern as a mask, thereby to form the UBM 15a including the first metal film 15 and the seed layer 16a including the second metal film 16.

Then, as shown in FIG. 9, an Au bump electrode 18 is formed over the seed layer 16a. The Au bump electrode 18 is an electrode for external coupling, and can be formed with, for example, a plating process or a ball process. With a plating process, an Au layer is formed by plating over the UBM 15a via the seed layer 16a. Then, flux is applied thereto. Subsequently, the Au layer is formed in spheres by a reflow treatment and removal and cleaning of the flux residue, and thus is electrically coupled with the bonding pad part M6 via the UBM 15a. With a ball process, flux is mask printed over the UBM 15a. Then, Au balls are mounted on the flux. Subsequently, each Au ball is coupled via the UBM 15a by a reflow treatment and removal and cleaning of the flux residue.

Thereafter, the semiconductor wafer is cut and divided into individual semiconductor chips. Thus, a semiconductor device is completed. A description thereon is omitted.

Incidentally, in this embodiment, as one example of the formation step of the seed layer 16a provided between the UBM 15a and the Au bump electrode 18 (step P6 of FIG. 3), a description was given to the method for cooling a semiconductor wafer using 2-step electrostatic chucking. However, the number of steps is not limited to 2, but may be 3 or more. FIG. 10 shows a schematic graph diagram for illustrating the changes in temperature of the semiconductor wafer with 3-step electrostatic chucking in accordance with this embodiment. In FIG. 10, the axis of ordinate shows the temperature of the semiconductor wafer and the voltage to be applied to the internal electrode provided in the stage; and the axis of abscissa shows the treatment time.

First, in the first step, a voltage V1 is applied to the internal electrode. As a result, the semiconductor wafer is cooled with the contact area between the back surface of the semiconductor wafer and the top surface of the stage being small. Thus, the temperature of the semiconductor wafer is slowly decreased. Then, in the second step, a voltage V2 higher than the voltage V1 applied to the internal electrode in the first step (V2>V1) is applied to the internal electrode. As a result, the force of electrostatic chucking is made stronger than that in the first step. Thus, the semiconductor wafer is cooled with the contact area between the back surface of the semiconductor wafer and the top surface of the stage having been increased than that in the first step. This reduces variations in temperature of the semiconductor wafer. Finally, in the third step, a voltage V3 higher than the voltage V2 applied to the internal electrode in the second step (V3>V2), namely, the chuck voltage is applied to the internal electrode. As a result, the force of electrostatic chucking is made further stronger than that in the second step. Thus, the semiconductor wafer is cooled with the entire back surface of the semiconductor wafer and the top surface of the stage being in uniform contact with each other. Accordingly, the temperature of the semiconductor wafer is converged to a desirable temperature for a short time.

By adopting such 3-step electrostatic chucking, the contact between the back surface of the semiconductor wafer and the top surface of the stage becomes more gentle than that with 2-step electrostatic chucking. Therefore, it is possible to reduce the number of foreign matters occurring on the top surface of the stage due to rubbing between the back surface of the semiconductor wafer and the stage. Incidentally, an increase in number of steps deteriorates the controllability of the stage temperature, which may result in a larger range of variations in temperature of the semiconductor wafer. For this reason, the time of each step is considered to be preferably at least 1 to 3 seconds.

Whereas, in this embodiment, the case where the present application is applied to the formation step of the seed layer 16a provided between the UBM 15a and the Au bump electrode 18 (step P6 of FIG. 3) was described. However, the present invention is not limited thereto.

For example, even when the same treatment chamber is shared between the wafer cooling step (step P6 of FIG. 3) and the Pd deposition step (step P7 of FIG. 3), and Pd deposition is carried out subsequent to the cooling treatment, desirable performances can be obtained.

The present application is also applicable to the formation step of an Al alloy film including, for example, Al—Cu—Si. Namely, the Al alloy film is formed over the top surface of the semiconductor wafer heated to 300 to 350° C. with a sputtering process. However, when the temperature of the semiconductor wafer is gradually reduced after deposition, Cu is precipitated. Precipitation of Cu causes defects such as a short circuit between wires. Thus, in order to suppress precipitation of Cu, the semiconductor wafer is rapidly cooled after deposition. The present application is applicable to the case where the rapid cooling of the semiconductor wafer is carried out on the top surface of the stage having an electrostatic chuck function.

Thus, in accordance with this embodiment, a semiconductor wafer is mounted on the top surface of the stage having an electrostatic chuck function, at a temperature within the range of −10° C. to room temperature. The semiconductor wafer at 50° C. or more (e.g., 200° C. to 350° C.) is cooled to a temperature lower than 50° C. (for example, room temperature). In this step, the voltage to be applied to the internal electrode provided in the stage is raised stepwise. Thus, the contact area between the back surface of the semiconductor wafer and the top surface of the stage is gradually increased. Finally, a chuck voltage is applied to the internal electrode, so that the entire back surface of the semiconductor wafer is uniformly attracted to the top surface of the stage. This reduces damage of the top surface of the stage due to rubbing between the back surface of the semiconductor wafer and the top surface of the stage, which can suppress dust generation.

Incidentally, the invention specifically described up to this point also includes the following embodiments. 1. A method for manufacturing a semiconductor device, which includes: a step of mounting, over the top surface of a stage at a first temperature having an electrostatic chuck function, a semiconductor wafer at a second temperature higher than the first temperature, and cooling the semiconductor wafer to a third temperature lower than the second temperature, characterized in that in the cooling step, the control voltage to be applied to an internal electrode provided in the stage is changed toward the higher voltage side from a first voltage to the n-th (n≧2) voltage stepwise. 2. The method for manufacturing a semiconductor device according to the item 1, characterized in that the first temperature falls within the range of from −10° C. to room temperature, and the second temperature is 50° C. or more. 3. The method for manufacturing a semiconductor device according to any of the items 1 and 2, characterized in that the third temperature is lower than 50° C. 4. The method for manufacturing a semiconductor device according to any of the items 1 to 3, characterized in that, when the n is 2, the time during which the first voltage is applied is longer than the time during which the second voltage is applied. 5. The method for manufacturing a semiconductor device according to any of the items 1 to 4, characterized in that, when the n is 3 or more, the total time during which the first voltage to the (n−1)th voltage are applied is longer than the time during which the n-th voltage is applied. 6. The method for manufacturing a semiconductor device according to any of the items 1 to 5, characterized in that the minimum time of respective times during which the first voltage to the (n−1)th voltage are applied is 1 to 3 seconds. 7. The method for manufacturing a semiconductor device according to any of the items 1 to 6, characterized in that the time during which the n-th voltage is applied is 15 seconds or less. 8. The method for manufacturing a semiconductor device according to any of the items 1 to 7, characterized in that the thermal shrinkage of the semiconductor wafer at each voltage when the first voltage to the (n−1)th voltage are applied is smaller than the thermal shrinkage of the semiconductor wafer when the n-th voltage is applied. 9. The method for manufacturing a semiconductor device according to any of the items 1 to 8, characterized in that the top surface of the stage is coated with a high dielectric material. 10. The method for manufacturing a semiconductor device according to the item 9, characterized in that the high dielectric material contains B and N. 11. The method for manufacturing a semiconductor device according to any of the items 1 to 10, characterized in that in the process of changing the control voltage from the first voltage to the n-th voltage in the cooling step, the contact area between the back surface of the semiconductor wafer and the top surface of the stage increases with the change. 12. The method for manufacturing a semiconductor device according to any of the items 1 to 11, characterized in that the cooling step is carried out after a step of depositing a titanium-containing film over the surface of the semiconductor wafer, and before a step of depositing a palladium-containing film over the surface of the titanium-containing film. 13. A method for manufacturing a semiconductor device, which includes: a step of mounting, over the top surface of a stage at a first temperature having an electrostatic chuck mechanism, a semiconductor substrate at a second temperature higher than the first temperature, and cooling the semiconductor substrate to a third temperature lower than the second temperature, characterized in that in the cooling step, the control voltage to be applied to an electrode of the electrostatic chuck mechanism is gradually increased toward the higher voltage side than the control voltage to be applied at the initial stage of the cooling step. 14. The method for manufacturing a semiconductor device according to the item 13, characterized in that in the process of increasing the control voltage in the cooling step, the contact area between the back surface of the semiconductor substrate and the top surface of the stage gradually increases. 15. The method for manufacturing a semiconductor device according to any of the items 13 and 14, characterized in that the cooling step is carried out after a step of depositing a titanium-containing film over the surface of the semiconductor substrate, and before a step of depositing a palladium-containing film over the surface of the titanium-containing film.

Up to this point, the invention made by the present inventors was specifically described by way of embodiments. However, the present invention is not limited to the embodiments. It is naturally understood that various changes may be made within the scope not departing from the gist thereof.

The present invention is applicable to a method for manufacturing a semiconductor device having a step of cooling a wafer over the top surface of a stage having an electrostatic chuck function.

What is claimed is:

1. A method for manufacturing a semiconductor device, comprising a step of:
   mounting, over a top surface of a stage at a first temperature having an electrostatic chuck function, a semiconductor wafer at a second temperature higher than the first temperature, and cooling the semiconductor wafer to a third temperature lower than the second temperature,
   wherein in the cooling step, a control voltage to be applied to an internal electrode provided in the stage is changed toward the higher voltage side from a first voltage to a n-th (n≧2) voltage stepwise.

2. The method for manufacturing a semiconductor device according to claim 1, wherein the first temperature falls within the range of from −10° C. to room temperature, and the second temperature is 50° C. or more.

3. The method for manufacturing a semiconductor device according to claim 1, wherein the third temperature is lower than 50° C.

4. The method for manufacturing a semiconductor device according to claim 1, wherein, when the n is 2, a time during which the first voltage is applied is longer than the time during which the second voltage is applied.

5. The method for manufacturing a semiconductor device according to claim 1, wherein, when the n is 3 or more, a total time during which the first voltage to the (n−1)th voltage are applied is longer than a time during which the n-th voltage is applied.

6. The method for manufacturing a semiconductor device according to claim 1, wherein a minimum time of respective times during which the first voltage to the (n−1)th voltage are applied is 1 to 3 seconds.

7. The method for manufacturing a semiconductor device according to claim 1, wherein a time during which the n-th voltage is applied is 15 seconds or less.

8. The method for manufacturing a semiconductor device according to claim 1, wherein a thermal shrinkage of the semiconductor wafer at each voltage when the first voltage to the (n−1)th voltage are applied is smaller than the thermal shrinkage of the semiconductor wafer when the n-th voltage is applied.

9. The method for manufacturing a semiconductor device according to claim 1, wherein the top surface of the stage is coated with a high dielectric material.

10. The method for manufacturing a semiconductor device according to claim 9, wherein the high dielectric material contains B and N.

11. The method for manufacturing a semiconductor device according to claim 1, wherein in the process of changing the control voltage from the first voltage to the n-th voltage in the cooling step, a contact area between the back surface of the semiconductor wafer and the top surface of the stage increases with the change.

12. The method for manufacturing a semiconductor device according to claim 1, wherein the cooling step is carried out after a step of depositing a titanium-containing film over the surface of the semiconductor wafer, and before a step of depositing a palladium-containing film over the surface of the titanium-containing film.

* * * * *